(12) United States Patent
Owen et al.

(10) Patent No.: US 11,664,660 B1
(45) Date of Patent: May 30, 2023

(54) APPARATUS, SYSTEM, AND METHOD FOR SELECTIVELY BALANCING POWER DRAWN FROM MULTIPLE POWER PLANTS VIA REDUNDANT POWER ARCHITECTURES

(71) Applicant: Juniper Networks, Inc., Sunnyvale, CA (US)

(72) Inventors: David K. Owen, Sunnyvale, CA (US); Jaspal S. Gill, Sunnyvale, CA (US); Marshall J. Lise, Sunnyvale, CA (US); Katsuhiro Okamura, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 323 days.

(21) Appl. No.: 17/077,203

(22) Filed: Oct. 22, 2020

(51) Int. Cl.
| | |
|---|---|
| *G06F 1/26* | (2006.01) |
| *H02J 3/14* | (2006.01) |
| *H03K 17/687* | (2006.01) |

(52) U.S. Cl.
CPC .................. *H02J 3/14* (2013.01); *G06F 1/26* (2013.01); *H03K 17/6871* (2013.01)

(58) Field of Classification Search
None
See application file for complete search history.

(56) References Cited

U.S. PATENT DOCUMENTS

| | | | |
|---|---|---|---|
| 6,191,500 B1* | 2/2001 | Toy ........................... | H02J 3/46 307/64 |
| 2005/0184590 A1* | 8/2005 | Dobbs ..................... | H02J 9/061 307/43 |
| 2009/0164806 A1* | 6/2009 | Dishman ................... | G06F 1/26 713/300 |
| 2014/0121787 A1* | 5/2014 | Yamazaki ............ | G05B 19/048 700/19 |
| 2015/0008746 A1* | 1/2015 | Youn ....................... | H02J 1/102 307/65 |
| 2015/0309522 A1* | 10/2015 | Fang ........................ | G05F 1/66 700/22 |
| 2016/0049822 A1* | 2/2016 | Lee ........................... | G06F 1/28 307/66 |
| 2016/0109932 A1* | 4/2016 | Jeon ...................... | G06F 1/3296 713/323 |
| 2017/0255242 A1* | 9/2017 | Halpern .................... | G06F 1/26 |
| 2019/0272016 A1* | 9/2019 | Frias ...................... | G06F 9/5094 |

* cited by examiner

*Primary Examiner* — Danny Chan
(74) *Attorney, Agent, or Firm* — Greenberg Traurig, LLP

(57) ABSTRACT

A disclosed apparatus may include (1) a first plurality of power feeds that are electrically ORed to form an channel input, wherein the channel input is electrically coupled to a first channel of a power supply, (2) a first plurality of switches electrically coupled inline on the first plurality of power feeds, wherein the first plurality of switches are individually programmable to open or close electrical continuity, (3) a second plurality of power feeds that are electrically ORed to form an additional channel input, wherein the additional channel input is electrically coupled to a second channel of the power supply, and (4) a second plurality of switches electrically coupled inline on the second plurality of power feeds, wherein the second plurality of switches are individually programmable to open or close electrical continuity. Various other apparatuses, systems, and methods are also disclosed.

19 Claims, 5 Drawing Sheets

APPARATUS, SYSTEM, AND METHOD FOR SELECTIVELY BALANCING POWER DRAWN FROM MULTIPLE POWER PLANTS VIA REDUNDANT POWER ARCHITECTURES

BACKGROUND

In today's world of vast computing technology, telecommunications devices are continually evolving to meet customers' needs and/or demands. For example, telecommunications equipment manufacturers often undertake efforts to increase the bitrates of their telecommunications devices. To do so, these manufacturers may also need to increase the power consumption of their telecommunications devices. Such increased power consumption may involve and/or necessitate power collectively drawn and/or sourced through multiple power supplies.

In addition, some telecommunications devices may need to provide and/or facilitate uninterrupted Internet connectivity. To achieve such uninterrupted Internet connectivity, these telecommunications devices may incorporate redundant power feeds that draw power from different power plants into their respective power supplies. Unfortunately, some conventional redundant power architectures that involve these redundant power feeds may be unable to control and/or select which power feeds and/or power plants are used to source the power consumed by the telecommunications devices at any given time.

Instead, such conventional redundant power architectures may be configured to automatically draw power from the power feed with the highest input voltage at any given time. As a result, such conventional redundant power architectures may cause the active power feed to oscillate from one power plant to another for a variety of reasons (such as load imbalances, power crashes, and/or power spikes), thereby potentially leading to current transients and/or voltage disturbances. The instant disclosure, therefore, identifies and addresses a need for apparatuses, systems, and methods for power plant balancing in connection with redundant power architectures.

SUMMARY

As will be described in greater detail below, the instant disclosure generally relates to apparatuses, systems, and methods for power plant balancing in connection with redundant power architectures. In one example, an apparatus for accomplishing such a task may include (1) a first channel of a power supply, (2) a second channel of the power supply, (3) a first plurality of power feeds that are electrically ORed to form an channel input for the first channel, wherein the channel input is electrically coupled to the first channel of the power supply, (4) a first plurality of switches electrically coupled inline on the first plurality of power feeds, wherein the first plurality of switches are individually programmable to open or close electrical continuity across the first plurality of power feeds, (5) a second plurality of power feeds that are electrically ORed to form an additional channel input for the second channel, wherein the additional channel input is electrically coupled to the second channel of the power supply, and (6) a second plurality of switches electrically coupled inline on the second plurality of power feeds, wherein the second plurality of switches are individually programmable to open or close electrical continuity across the second plurality of power feeds.

Similarly, a system for accomplishing such a task may include (1) a first plurality of power feeds that are electrically ORed to form an channel input for a first channel of a power supply, wherein the channel input is electrically coupled to the first channel of the power supply, (2) a first plurality of switches electrically coupled inline on the first plurality of power feeds, wherein the first plurality of switches are individually programmable to open or close electrical continuity across the first plurality of power feeds, (3) a first plurality of current-control components that are electrically coupled inline on the first plurality of power feeds, wherein the first plurality of current-control components are configured to prevent current from flowing away from the first channel of the power supply via any of the first plurality of power feeds, (4) a second plurality of power feeds that are electrically ORed to form an additional channel input for a second channel of the power supply, wherein the additional channel input is electrically coupled to the second channel of the power supply, (5) a second plurality of switches electrically coupled inline on the second plurality of power feeds, wherein the second plurality of switches are individually programmable to open or close electrical continuity across the second plurality of power feeds, and (6) a second plurality of current-control components that are electrically coupled inline on the second plurality of power feeds, wherein the second plurality of current-control components are configured to prevent current from flowing away from the second channel of the power supply via any of the second plurality of power feeds.

A corresponding method may include (1) electrically ORing a first plurality of power feeds to form an channel input for a first channel of a power supply, (2) electrically coupling the channel input to the first channel of the power supply, (3) electrically coupling a first plurality of switches inline on the first plurality of power feeds to facilitate controlling electrical continuity across the first plurality of power feeds, (4) electrically ORing a second plurality of power feeds to form an additional channel input for a second channel of the power supply, (5) electrically coupling the channel input to the second channel of the power supply, and (6) electrically coupling a second plurality of switches inline on the second plurality of power feeds to facilitate controlling electrical continuity across the second plurality of power feeds.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
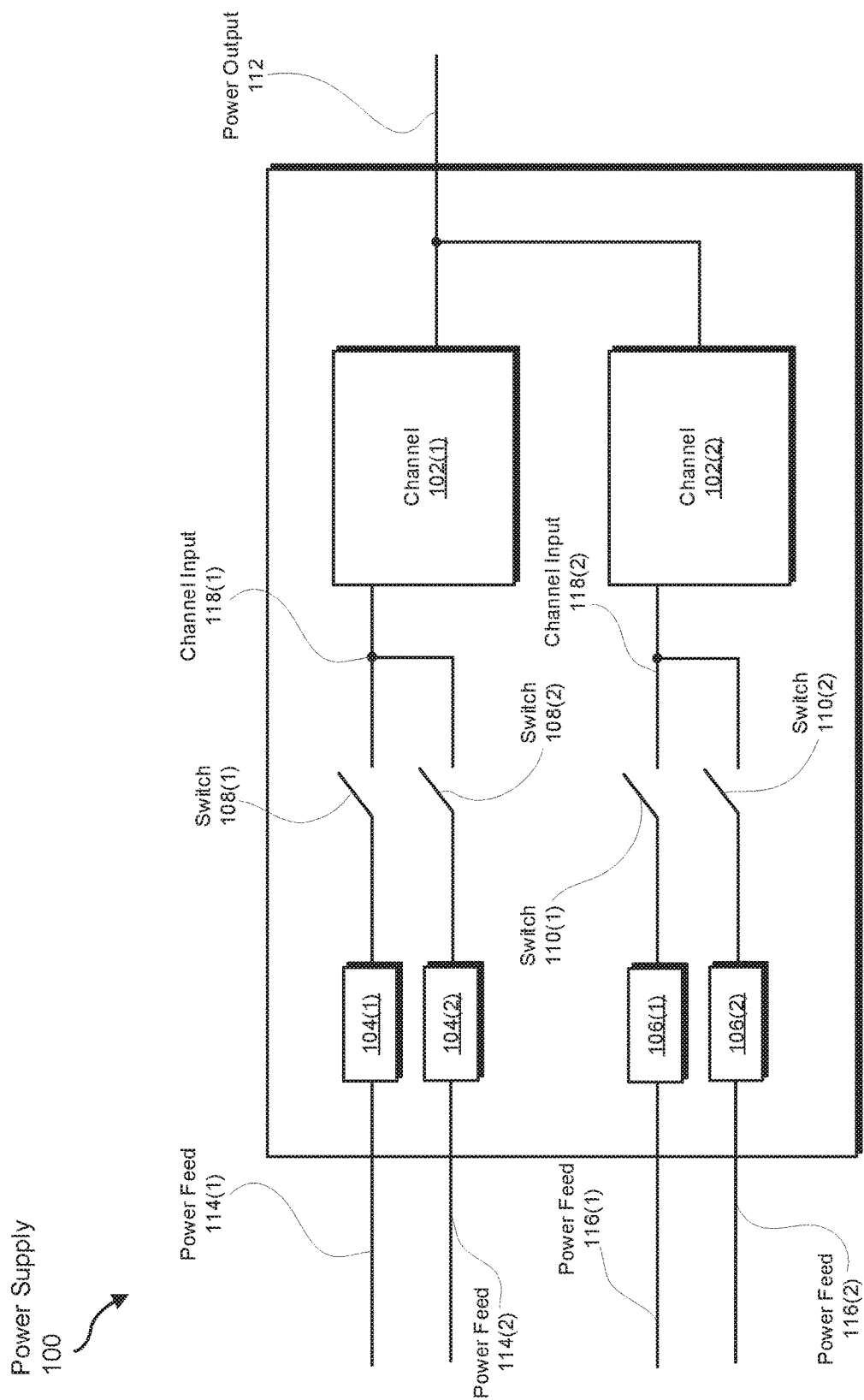
FIG. 1 is a block diagram of an exemplary power supply that facilitates and/or supports power plant balancing in connection with redundant power architectures.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for power plant balancing in connection with redundant power architectures. As will be explained in greater detail below, embodiments of the instant disclosure may be able to prevent, reduce, and/or mitigate current transients, oscillations, current imbalances, and/or voltage disturbances in telecommunications devices with redundant power architectures. Additionally or alternatively, embodiments of the instant disclosure may be able to selectively and/or programmably provision or share power and/or current across redundant power feeds. By doing so, such embodiments may facilitate and/or support graceful switchovers between the redundant power feeds.

The following will provide, with reference to FIG. 1-4, detailed descriptions of exemplary components, apparatuses, systems, configurations, and/or implementations for power plant balancing in connection with redundant power architectures. In addition, the discussion corresponding to FIG. 5 will provide a detailed description of an exemplary method for power plant balancing in connection with redundant power architectures.

FIG. 1 illustrates an exemplary power supply 100 that includes and/or represents channels 102(1) and 102(2). In some examples, power supply 100 may constitute and/or represent a Direct Current (DC) power supply and/or a Device to Device (D2D) power supply. As illustrated in FIG. 1, power supply 100 may also include and/or represent power feeds 114(1) and 114(2) that are electrically ORed by current-control components 104(1) and 104(2) to form channel input 118(1) for channel 102(1).

In some examples, channel input 118(1) may be electrically coupled to channel 102(1) of power supply 100. In such examples, channel 102(1) may facilitate and/or support the flow, passage, and/or transfer of electric power and/or current from one or more power plants (not necessarily illustrated in FIG. 1) to one or more computing devices (not necessarily illustrated in FIG. 1) via a power output 112.

Such computing devices each generally represent any type or form of physical computing devices capable of reading computer-executable instructions and/or handling network traffic. Examples of such computing devices include, without limitation, network devices, routers (such as provider edge routers, hub routers, spoke routers, autonomous system boundary routers, and/or area border routers), switches, hubs, modems, bridges, repeaters, gateways (such as Broadband Network Gateways (BNGs)), multiplexers, network adapters, network interfaces, client devices, laptops, tablets, desktops, servers, cellular phones, Personal Digital Assistants (PDAs), multimedia players, embedded systems, wearable devices, gaming consoles, variations or combinations of one or more of the same, and/or any other suitable computing devices.

In addition, power supply 100 may include and/or represent power feeds 116(1) and 116(2) that are electrically ORed by current-control components 106(1) and 106(2) to form channel input 118(2) for channel 102(2). In some examples, channel input 118(2) may be electrically coupled to channel 102(2) of power supply 100. In such examples, channel 102(2) may facilitate and/or support the flow, passage, and/or transfer of electric power and/or current from one or more power plants (not necessarily illustrated in FIG. 1) to one or more computing devices (not necessarily illustrated in FIG. 1) via power output 112.

As illustrated in FIG. 1, power supply 100 may also include and/or represent switches 108(1) and 108(2) electrically coupled inline on power feeds 114(1) and 114(2), respectively. For example, switches 108(1) and 108(2) may be electrically coupled between current-control components 104(1) and 104(2) and channel input 118(1). In other words, switch 108(1) may be electrically coupled between current-control component 104(1) and channel input 118(1), and switch 108(2) may be electrically coupled between current-control component 104(2) and channel input 118(1).

In some examples, switches 108(1) and 108(2) may be individually programmable and/or configurable to open or close electrical continuity across power feeds 114(1) and 114(2). Accordingly, if switch 108(1) is open, power feed 114(1) may be electrically decoupled, uncoupled, and/or disconnected from channel input 118(1). However, if switch 108(1) is closed, power feed 114(1) may be electrically coupled and/or connected to channel input 118(1). Similarly, if switch 108(2) is open, power feed 114(2) may be electrically decoupled, uncoupled, and/or disconnected from channel input 118(1). However, if switch 108(2) is closed, power feed 114(2) may be electrically coupled and/or connected to channel input 118(1).

As illustrated in FIG. 1, power supply 100 may further include and/or represent switches 110(1) and 110(2) electrically coupled inline on power feeds 116(1) and 116(2), respectively. For example, switches 110(1) and 110(2) may be electrically coupled between current-control components 106(1) and 106(2) and channel input 118(2). In other words, switch 110(1) may be electrically coupled between current-control component 106(1) and channel input 118(2), and switch 110(2) may be electrically coupled between current-control component 106(2) and channel input 118(2).

In some examples, switches 110(1) and 110(2) may be individually programmable and/or configurable to open or close electrical continuity across power feeds 116(1) and 116(2). Accordingly, if switch 110(1) is open, power feed 116(1) may be electrically decoupled, uncoupled, and/or disconnected from channel input 118(2). However, if switch 110(1) is closed, power feed 116(1) may be electrically coupled and/or connected to channel input 118(2). Similarly, if switch 110(2) is open, power feed 116(2) may be electrically decoupled, uncoupled, and/or disconnected from channel input 118(2). However, if switch 110(2) is closed, power feed 116(2) may be electrically coupled and/or connected to channel input 118(2).

In some examples, current-control components 104(1), 104(2), 106(1), and/or 106(2) may refer to and/or represent any type or form of physical hardware, circuit, device, and/or processor that ORs (e.g., performs and/or facilitates a logical OR operation on) electric power and/or current provided by different power sources (such as different power plants). Examples of current-control components 104(1), 104(2), 106(1), and/or 106(2) include, without limitation, diodes (such as ORing diodes), active ORing devices, transistors (such as power Field-Effect Transistors (FETs) and/or Metal-Oxide-Semiconductor FETs (MOSFETs)), variations of one or more of the same, combinations of one or more of the same, or any other suitable type or form of current-control components.

In some examples, switches 108(1), 108(2), 110(1), and/or 110(2) may refer to and/or represent any type or form of physical hardware, circuit, device, and/or processor that facilitates switching and/or oscillating between open (e.g., without electrical continuity) and/or closed (e.g., with electrical continuity) positions. Examples of switches 108(1), 108(2), 110(1), and/or 110(2) include, without limitation, transistors (such as power FETs, MOSFETS, and/or Junction gate FETs (JFETs)), physical switches, electrical switches, variations of one or more of the same, combinations of one or more of the same, or any other suitable type or form of switches.

In some examples, the input voltage range for power supply 100 may be from approximately 40 volts DC to approximately 72 volts DC. In such examples, the output voltage for power supply 100 may be approximately 54 volts DC, and each channel of power supply 100 may supply and/or provide approximately 42 amps DC. In one example, power feeds 114(1) and 114(2) may be unable and/or not configured to share current with one another. As power supply 100 is able to programmably select which power feed to activate per channel, power supply 100 may facilitate and/or improve power plant balancing and/or provisioning while controlling input feed current oscillation.

In some examples, current-control components 104(1) and 104(2) may be electrically coupled inline on power feeds 114(1) and 114(2), respectively. In these examples, current-control components 104(1) and 104(2) may prevent current from flowing away from channel 102(1) via any of power feeds 114(1) and 114(2). In other words, current-control components 104(1) and 104(2) may prevent current from flowing back toward the power plants (e.g., due to a voltage imbalance).

Similarly, current-control components 106(1) and 106(2) may be electrically coupled inline on power feeds 116(1) and 116(2), respectively. In these examples, current-control components 106(1) and 106(2) may prevent current from flowing away from channel 102(2) via any of power feeds 116(1) and 116(2). In other words, current-control components 106(1) and 106(2) may prevent current from flowing back toward the power plants (e.g., due to a voltage imbalance).

In some examples, power output 112 of power supply 100 may provide and/or carry a summation of power and/or current drawn from channels 102(1) and 102(2) to a computing device (such as a router). In other words, the amount of power and/or current provided and/or carried by power output 112 to that computing device may include and/or represent a sum and/or combination of the amount of power and/or current collectively originating from channels 102(1) and 102(2).

As will be described in greater detail below, power output 112 of power supply 100 may be combined with additional power outputs of additional power supplies. The additional power outputs of the additional power supplies may provide and/or carry a summation of power and/or current drawn from their corresponding channels to that same computing device. In other words, the amount of power and/or current provided and/or carried by the additional power outputs to that computing device may include and/or represent a sum and/or combination of the amount of power and/or current collectively originating from their respective channels. Further, the power outputs of the various power supplies may be summed together for the computing device such that the computing device is able to simultaneously consume the summation of power and/or current drawn from power supply 100 in addition to the power and/or current drawn from the additional power supplies.

Figure 2:
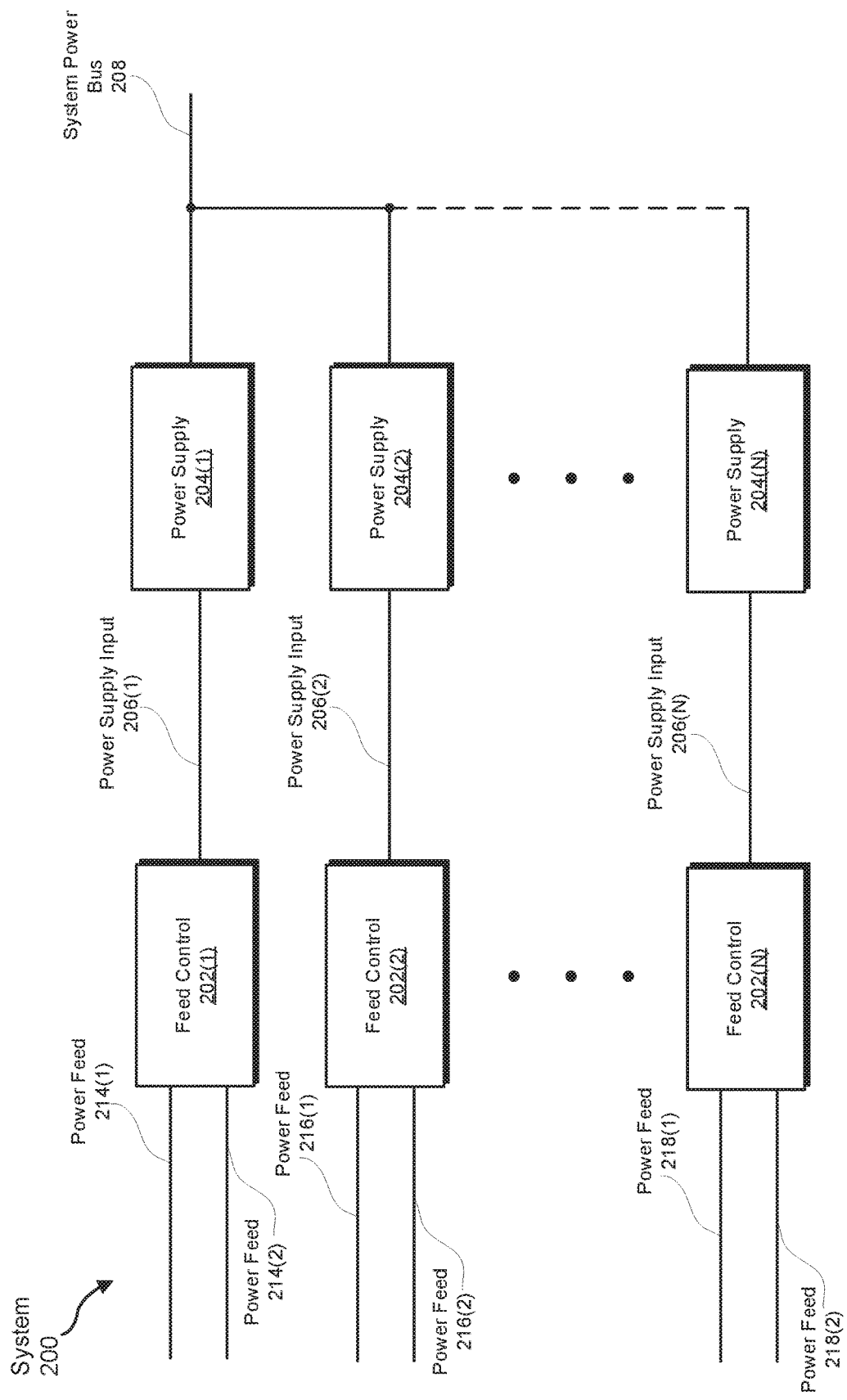
FIG. 2 is a block diagram of an exemplary system for power plant balancing in connection with redundant power architectures.

FIG. 2 illustrates an exemplary system 200 that includes and/or represents power supplies 204(1)-(N) whose outputs combine in one way or another to form a system power bus 208. As illustrated in FIG. 2, system 200 may also include and/or represent feed controls 202(1)-(N) as well as power feeds 214(1), 214(2), 216(1), 216(2), 218(1), and/or 218(2) and power supply inputs 206(1)-(N). In some examples, power feeds 214(1) and 214(2) may be electrically coupled as inputs to feed control 202(1), and power feeds 216(1) and 216(2) may be electrically coupled as inputs to feed control 202(2). Additionally or alternatively, power feeds 218(1) and 218(2) may be electrically coupled as inputs to feed control 202(N).

As illustrated in FIG. 2, feed control 202(1) may be electrically coupled between power feeds 214(1)-(2) and power supply input 206(1), and feed control 202(2) may be electrically coupled between power feeds 216(1)-(2) and power supply input 206(2). Additionally or alternatively, power feeds 218(1) and 218(2) may be electrically coupled as inputs to feed control 202(N).

In some examples, power supplies 204(1)-(N) may each include and/or represent a channel that facilitates and/or supports the flow, passage, and/or transfer of electric power and/or current from one or more power plants (not necessarily illustrated in FIG. 2) to one or more computing devices (not necessarily illustrated in FIG. 2) via system power bus 208. Accordingly, system 200 may include and/or incorporate various channels that are electrically ORed and/or summed to form system power bus 208. In one example, power supplies 204(1)-(N) may each include and/or represent an implementation and/or instance of power supply 100 in FIG. 1. In another example, power supplies 204(1)-(N) may each include and/or represent a variant and/or distinct version of power supply 100 in FIG. 1.

In some examples, feed controls 202(1)-(N) may each include and/or represent any type or form of circuitry, device, and/or design that controls and/or facilitates selecting which power feed to make active and/or pass to power supply inputs 206(1)-(N), respectively. As will be described in greater detail below (e.g., in connection with FIG. 3), feed controls 202(1)-(N) may each include and/or represent a combination of transistors configured and/or designed to operate or support the power ORing and/or switching features of system 200.

In some examples, system 200 may include and/or represent 2+N power supplies with dual input power feed redundancy. In such examples, the dual input power feed redundancy may minimize and/or optimize the number of D2D power supplies that are required for system 200. In one example, feed controls 202(1)-(N) may enable each of power supplies 204(1)-(N) to receive and/or obtain power and/or current from a specific power feed. In contrast, without such an implementation, the active power feed may be compelled by the highest input voltage. As a result, without such an implementation, the active power feed may randomly and/or periodically switch or oscillate from one to another.

Figure 3:
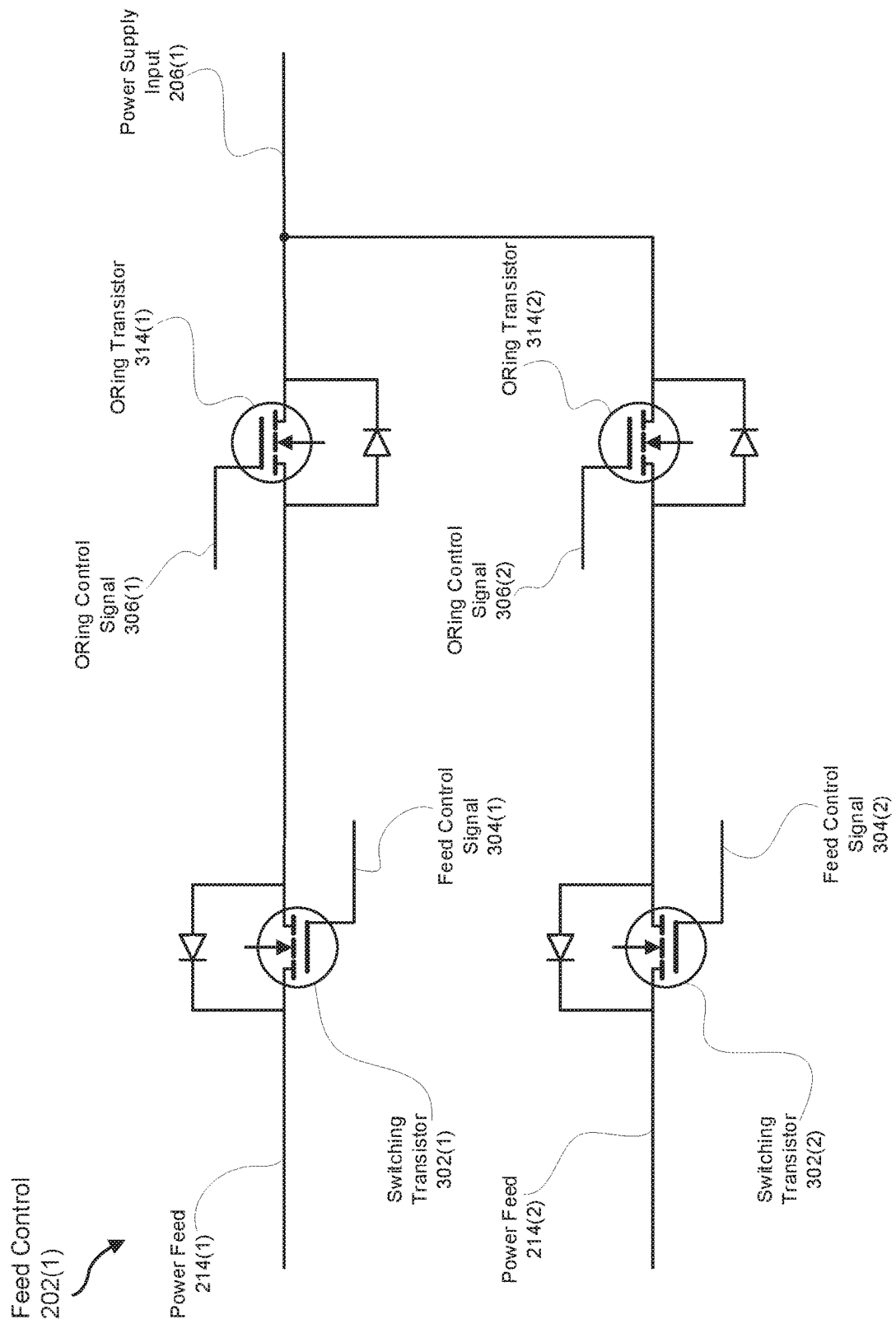
FIG. 3 is a schematic of an exemplary feed control that facilitates and/or supports power plant balancing in connection with redundant power architectures.

FIG. 3 illustrates an exemplary implementation and/or instance of feed circuit 202(1). As illustrated in FIG. 3, feed control 202(1) may include and/or represent switching transistors 302(1)-(2) and ORing transistors 314(1)-(2). In some examples, switching transistors 302(1) and 302(2) may control and/or be responsible for switching and/or oscillating between open and closed positions. In such examples, the switching and/or oscillating of switching transistors 302(1) and 302(2) may be controlled and/or dictated by feed control signals 304(1) and 304(2), respectively.

In some examples, in the open position, switching transistor 302(1) may prevent electrical continuity between power feed 214(1) and power supply input 206(1). Similarly, in the open position, switching transistor 302(2) may prevent electrical continuity between power feed 214(2) and power supply input 206(1).

In contrast, in the closed position, switching transistor 302(1) may create, provide, and/or cause electrical continuity between power feed 214(2) and power supply input 206(1). Similarly, in the closed position, switching transistor 302(2) may create, provide, and/or cause electrical continuity between power feed 214(2) and power supply input 206(1).

In some examples, ORing transistors 314(1) and 302(2) may control and/or be responsible for ORing power and/or current carried and/or supplied by power feeds 214(1) and 214(2). In such examples, the ORing performed by ORing transistors 314(1) and 302(2) may be controlled and/or dictated by ORing control signals 306(1) and 306(2), respectively. Although feed control 202(1) in FIG. 2 is configured with ORing transistors 314(1) and 314(2) coupled directly to power supply input 206(1), alternative embodiments of feed control 202(1) may include and/or represent a configuration in which the positions of switching transistors 302(1)-(2) and ORing transistors 314(1)-(2) are switched and/or swapped relative to one another. For example, in an alternative embodiment, switching transistors 302(1)-(2) may be electrically coupled between power supply input 206(1) and ORing transistors 314(1)-(2), respectively.

In one example, with reference to FIGS. 1 and 3, switching transistors 302(1) and 302(2) in FIG. 3 may correspond to and/or represent switches 108(1) and 108(2), respectively, in FIG. 1. In this example, ORing transistors 314(1) and 314(2) in FIG. 3 may correspond to and/or represent current-control components 104(1) and 104(2), respectively, in FIG. 1.

As illustrated in FIG. 3, switching transistor 302(1) and ORing transistor 314(1) may be electrically coupled in series with one another between power feed 214(1) and power supply input 206(1). Similarly, switching transistor 302(2) and ORing transistor 314(2) may be electrically coupled in series with one another between power feed 214(2) and power supply input 206(1).

In some examples, the orientations of switching transistor 302(1)-(2) and ORing transistors 314(1)-(2) may be opposite of one another and/or back-to-back relative to one another. For example, the drains of switching transistor 302(1) and ORing transistor 314(1) may be electrically coupled together within feed control 202(1). Additionally or alternatively, the drains of switching transistor 302(2) and ORing transistor 314(2) may be electrically coupled together within feed control 202(1). In another example, the sources of switching transistor 302(1) and ORing transistor 314(1) may be electrically coupled together within feed control 202(1). In this example, the sources of switching transistor 302(2) and ORing transistor 314(2) may be electrically coupled together within feed control 202(1).

Accordingly, feed control 202(1) may include and/or represent multiple FETs coupled in a back-to-back configuration. In one example, feed control signals 304(1)-(2) and ORing control signals 306(1)-(2) may collectively control and/or dictate which power path is selected and/or activated. Additionally or alternatively, feed control signals 304(1)-(2) and ORing control signals 306(1)-(2) may collectively control and/or dictate which power path is blocked and/or deactivated.

In some examples, feed control 202(1) may enable system 200 to share current between and/or across power feeds 214(1) and 214(2) when implemented in a DC power plant with unregulated input voltage or varying power distribution voltage drops and/or battery charge or discharge cycles. In one embodiment, feed control 202(1) may include and/or represent the source power path to one or more computing devices via system power bus 208. In this embodiment, system 200 may further include and/or represent one or more return power paths (not necessarily illustrated in FIGS. 2 and 3) that lead back to the power plants to close the circuit and/or loop.

Figure 4:
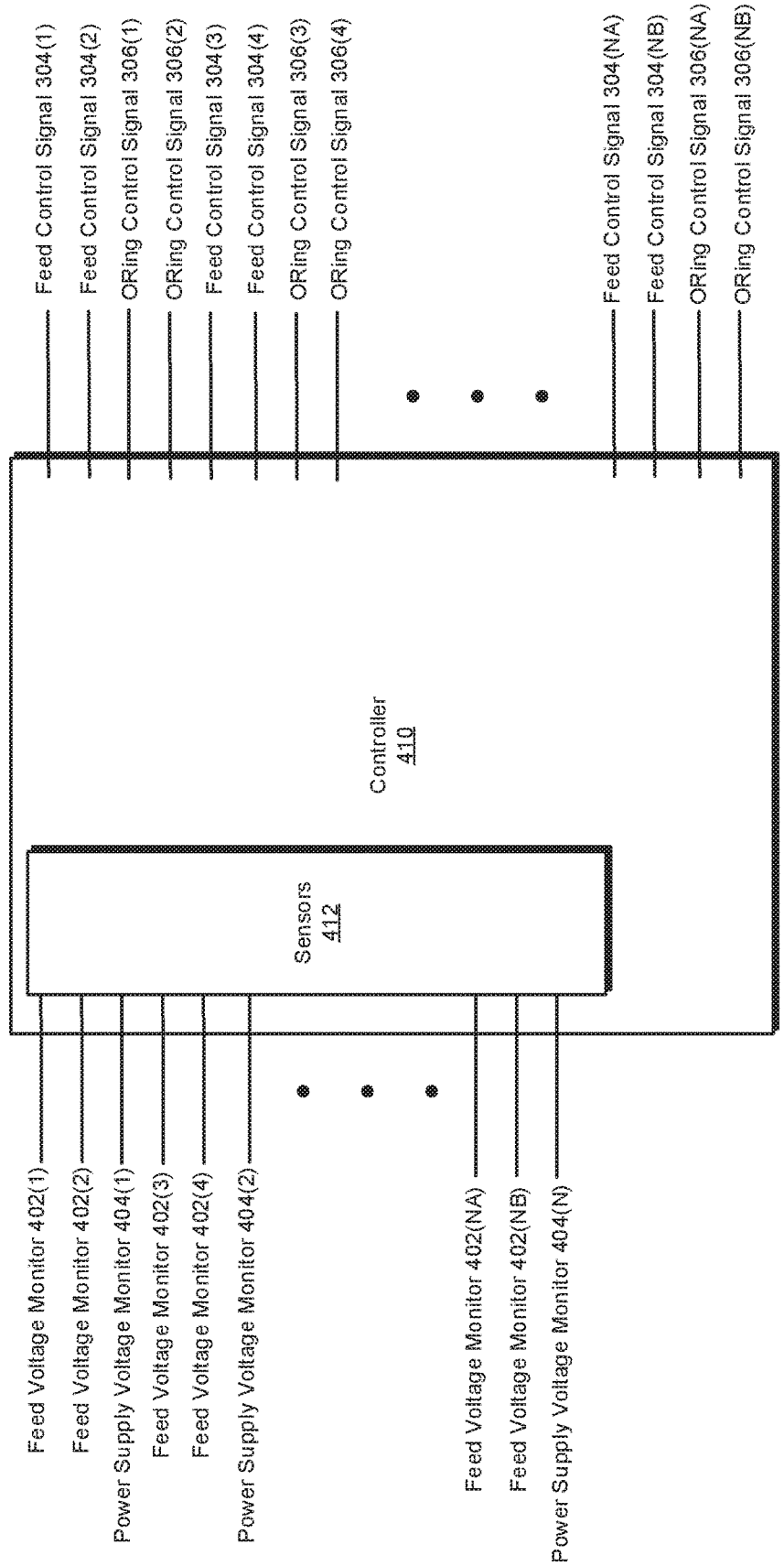
FIG. 4 is a schematic of an exemplary implementation of a controller for power plant balancing in connection with redundant power architectures.

FIG. 4 illustrates an exemplary implementation 400 of a controller 410 that controls and/or programs power supplies via control signals. In exemplary implementation 400, controller 410 may be communicatively coupled to current-control components 104(1)-(2) and/or 106(1)-(2) and/or may control or program those current-control components via control signals. Additionally or alternatively, controller 410 may be communicatively coupled to switches 108(1)-(2) and/or 110(1)-(2) and/or may control or program those switches via control signals.

In a specific example with reference to FIGS. 3 and 4, controller 410 in FIG. 4 may be communicatively coupled to switching transistors 302(1) and 302(2) via feed control signals 304(1) and 304(2), respectively. In this example, controller 410 in FIG. 4 may also be communicatively coupled to ORing transistors 314(1) and 314(2) via ORing control signals 306(1) and 306(2), respectively. Through such communicative couplings, controller 410 may be able to control and/or program switching transistors 302(1) and 302(2) via feed control signals 304(1) and 304(2), respectively. Additionally or alternatively, controller 410 may be able to control and/or program ORing transistors 314(1) and 314(2) via ORing control signals 306(1) and 306(2), respectively.

As illustrated in FIG. 4, exemplary implementation 400 may include and/or represent numerous Input/Output (I/O) signals used in conjunction with a number of power supplies. For example, controller 410 may be communicatively coupled to current-control components 104(1)-(2) and/or 106(1)-(2) and/or may control or program those current-control components via ORing control signals 306(1)-(2) and 306(3)-(4), respectively. Additionally or alternatively, controller 410 may be communicatively coupled to switches 108(1)-(2) and/or 110(1)-(2) and/or may control or program those switches via feed control signals 304(1)-(2) and 304 (3)-(4), respectively.

Further, controller 410 may be communicatively coupled to one or more additional current-control components and/or may control or program those additional current-control components via ORing control signals 306(NA)-(NB), respectively. Additionally or alternatively, controller 410 may be communicatively coupled to one or more additional switches and/or may control or program those additional switches via feed control signals 304(NA)-(NB), respectively.

As illustrated in FIG. 4, exemplary implementation 400 may also include and/or represent numerous analog and/or digital input signals used to monitor voltage levels measured at the power feeds, channel inputs, and/or power supply inputs of power supplies. For example, controller 410 may be communicatively coupled to power feeds 214(1)-(2), 216(1)-(2), and 218(1)-(2) and/or detect or monitor voltage levels at those power feeds via feed voltage monitors 402(1)-(2), 402(3)-(4), and 402(NA)-(NB), respectively. Additionally or alternatively, controller 410 may be communicatively coupled to power supply inputs 206(1)-(2) and 206(N) and/or detect or monitor voltage levels at those power supply inputs via power supply voltage monitors 404(1)-(2) and 404(N), respectively.

In some examples, controller 410 may include and/or incorporate one or more sensors 412. Alternatively, sensors 412 may be implemented separately from controller 410 as one or more stand-alone devices that are communicatively coupled to controller 410. In one example, sensors 412 may include and/or represent analog-to-digital converters configured to measure voltage levels present and/or detectable on feed voltage monitors 402(1)-(NB) and/or power supply voltage monitors 404(1)-(N).

In some examples, sensors 412 may detect voltage levels of feed voltage monitors 402(1)-(NB) and/or power supply voltage monitors 404(1)-(N). In such examples, sensors 412 may communicate those voltage levels to controller 410. In one example, controller 410 may determine that one of the voltage levels detected on feed voltage monitors 402(1)-(NB) and/or power supply voltage monitors 404(1)-(N) satisfies a certain threshold. In response to this determination, controller 410 may reprogram and/or reconfigure the corresponding feed control (e.g., one or more of the internal switches) to a different configuration.

In another example, controller 410 may be communicatively coupled to power feeds 114(1)-(2) and 116(1)-(2) and/or may detect or monitor voltage levels at those power feeds via feed voltage monitors 402(1)-(2) and 402(3)-(4), respectively. Additionally or alternatively, controller 410 may be communicatively coupled to channel inputs 118(1) and 118(2) and/or may detect or monitor voltage levels at those channel inputs via power supply voltage monitors 404(1) and 404(2), respectively.

In some examples, controller 410 may implement and/or execute an algorithm that verifies whether the power feeds are available to provide and/or source power. In such examples, controller 410 may maintain the active power feed independent of the input voltages, varying power distribution voltage drops, and/or battery charge or discharge cycles. Accordingly, controller 410 may be able to switch from the active power feed to an alternative power feed for backup when the active power feed falls and/or is no longer available.

In some examples, controller 410 may change and/or fail over the active power feed depending on a certain threshold power level and/or the measured voltage levels of the corresponding power feeds. For example, controller 410 may set and/or modify the threshold power level for determining which power feeds to activate and/or deactivate at any given time. In this example, upon detecting a change in the voltage levels among the corresponding power feeds, controller 410 may switch and/or fail over the active power feed to the alternative power feed due at least in part to the threshold power level. Accordingly, controller 410 may be able to control and/or dictate the active power feed programmatically, as opposed to simply following the highest power plant operating voltage. By doing so, controller 410 may be able to provide a deterministic and/or controlled power allocation and/or distribution for power plant operators and/or administrators.

In some examples, controller 410 may program current-control components 104(1)-(2) and/or 106(1)-(2) as well as switches 108(1)-(2) and/or 110(1)-(2) to a specific configuration. In one example, the specific configuration programmed by controller 410 may cause power supply 100 to provide and/or carry a portion of power and/or current drawn from channel 102(1) to a computing device (such a router) via power output 112. In this example, the specific configuration programmed by controller 410 may cause power supply 100 to provide and/or carry another portion of power and/or current drawn from channel 102(1) to that computing device via power output 112. The portions of power and/or current drawn from channels 102(1) and 102(2) may be substantially equal to one another. Alternatively, the portions of power and/or current drawn from channels 102(1) and 102(2) may be substantially different from one another.

Figure 5:
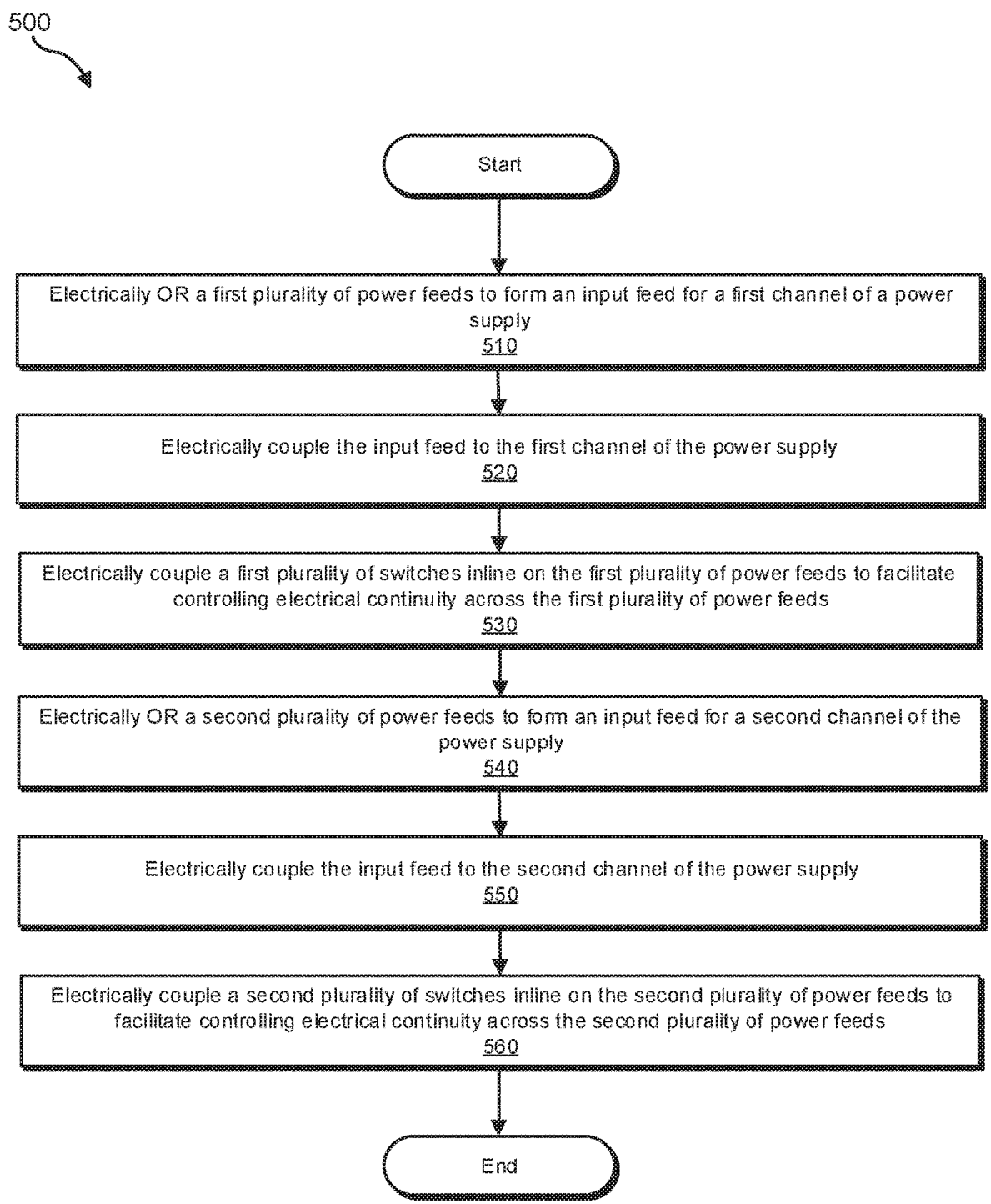
FIG. 5 is a flow diagram of an exemplary method for power plant balancing in connection with redundant power architectures.

FIG. 5 is a flow diagram of an exemplary method 500 for power plant balancing in connection with redundant power architectures. Method 500 may include the step of electrically ORing a first plurality of power feeds to form an input feed for a first channel of a power supply (510). Step 510 may be performed in a variety of ways, including any of those described above in connection with FIGS. 1-4. For example, a computing equipment manufacturer or subcontractor may manufacture one or more power supplies for a network device (such as a router). In this example, as part of the manufacturing process, the computing equipment manufacturer or subcontractor may electrically OR a first plurality of power feeds to form an input feed for a first channel of each power supply. Such electrical ORing may be accomplished and/or achieved by applying one or more current-control components (such as ORing diodes, active ORing devices, and/or FETs) to the first plurality of power feeds.

Method 500 may also include the step of electrically coupling the input feed to the first channel of the power supply (520). Step 520 may be performed in a variety of ways, including any of those described above in connection with FIGS. 1-4. For example, as part of the manufacturing process, the computing equipment manufacturer or subcontractor may electrically couple the input feed to the first channel of each power supply. In one example, the computing equipment manufacturer or subcontractor may form and/or achieve this electrical coupling by soldering and/or reflow processes.

Method 500 may further include the step of electrically coupling a first plurality of switches inline on the first plurality of power feeds to facilitate controlling electrical continuity across the first plurality of power feeds (530). Step 530 may be performed in a variety of ways, including any of those described above in connection with FIGS. 1-4. For example, as part of the manufacturing process, the computing equipment manufacturer or subcontractor may electrically couple a first plurality of switches inline on the first plurality of power feeds to facilitate controlling electrical continuity across the first plurality of power feeds. In one example, the computing equipment manufacturer or subcontractor may form and/or achieve such electrical couplings by soldering and/or reflow processes.

Method 500 may include the step of electrically ORing a second plurality of power feeds to form an input feed for a second channel of the power supply (540). Step 540 may be performed in a variety of ways, including any of those described above in connection with FIGS. 1-4. For example, as part of the manufacturing process, the computing equipment manufacturer or subcontractor may electrically OR a second plurality of power feeds to form an input feed for a second channel of each power supply. As mentioned above, such electrical ORing may be accomplished and/or achieved by applying one or more current-control components (such as ORing diodes, active ORing devices, and/or FETs) to the second plurality of power feeds.

Method 500 may also include the step of electrically coupling the input feed to the second channel of the power supply (550). Step 550 may be performed in a variety of ways, including any of those described above in connection with FIGS. 1-4. For example, as part of the manufacturing process, the computing equipment manufacturer or subcontractor may electrically couple the input feed to the second channel of each power supply. In one example, the computing equipment manufacturer or subcontractor may form and/or achieve this electrical coupling by soldering and/or reflow processes.

Method 500 may further include the step of electrically coupling a second plurality of switches inline on the second plurality of power feeds to facilitate controlling electrical continuity across the second plurality of power feeds (560). Step 560 may be performed in a variety of ways, including any of those described above in connection with FIGS. 1-4. For example, as part of the manufacturing process, the computing equipment manufacturer or subcontractor may electrically couple a second plurality of switches inline on the second plurality of power feeds to facilitate controlling electrical continuity across the second plurality of power feeds. In one example, the computing equipment manufacturer or subcontractor may form and/or achieve such electrical couplings by soldering and/or reflow processes.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a first channel of a power supply;
a second channel of the power supply;
a first plurality of power feeds that are electrically ORed to form a channel input for the first channel, wherein the channel input is electrically coupled to the first channel of the power supply;
a first plurality of switches electrically coupled inline on the first plurality of power feeds, wherein the first plurality of switches are individually programmable to open or close electrical continuity across the first plurality of power feeds;
a second plurality of power feeds that are electrically ORed to form an additional channel input for the second channel, wherein the additional channel input is electrically coupled to the second channel of the power supply;
a second plurality of switches electrically coupled inline on the second plurality of power feeds, wherein the second plurality of switches are individually programmable to open or close electrical continuity across the second plurality of power feeds;
a first plurality of current-control components that are electrically coupled inline on the first plurality of power feeds, wherein the first plurality of current-control components are configured to prevent current from flowing away from the first channel of the power supply via any of the first plurality of power feeds; and
a second plurality of current-control components that are electrically coupled inline on the second plurality of power feeds, wherein the second plurality of current-control components are configured to prevent current from flowing away from the second channel of the power supply via any of the second plurality of power feeds.

2. The apparatus of claim 1, wherein:
the first plurality of current-control components comprises a first set of power field-effect transistors; and
the second plurality of current-control components comprises a second set of power field-effect transistors.

3. The apparatus of claim 2, wherein:
the first plurality of switches comprises a third set of power field-effect transistors; and
the second plurality of switches comprises a fourth set of power field-effect transistors.

4. The apparatus of claim 3, wherein:
each power feed included in the first plurality of power feeds comprises a power field-effect transistor included in the first set of power field-effect transistors electrically coupled in series with a power field-effect transistor included in the third set of power field-effect transistors; and each power feed included in the second plurality of power feeds comprises a power field-effect transistor included in the second set of power field-effect transistors electrically coupled in series with a power field-effect transistor included in the fourth set of power field-effect transistors.

5. The apparatus of claim 4, wherein:
an orientation of the power field-effect transistor included in the first set of power field-effect transistors and an orientation of the power field-effect transistor included in the third set of power field-effect transistors are arranged opposite of one another within each power feed included in the first plurality of power feeds; and
an orientation of the power field-effect transistor included in the second set of power field-effect transistors and an orientation of the power field-effect transistor included in the fourth set of power field-effect transistors are arranged opposite of one another within each power feed included in the second plurality of power feeds.

6. The apparatus of claim 1, further comprising a controller of the power supply communicatively coupled to the first plurality of switches and the second plurality of switches, wherein the controller programs the first plurality of switches and the second plurality of switches to a specific configuration.

7. The apparatus of claim 6, further comprising the specific configuration programmed by the controller causes the power supply to provide:
a portion of power drawn from the first channel to a computing device; and
another portion of power drawn from the second channel to the computing device.

8. The apparatus of claim 6, further comprising at least one sensor communicatively coupled to the controller, wherein the sensor:
detects voltage levels of the first plurality of power feeds and the second plurality of power feeds; and
communicates the voltage levels of the first plurality of power feeds and the second plurality of power feeds to the controller.

9. The apparatus of claim 8, wherein the controller:
determines that one of the voltage levels of the first plurality of power feeds and the second plurality of power feeds satisfies a certain threshold; and
in response to determining that the one of the voltage levels of the first plurality of power feeds and the second plurality of power feeds satisfies the certain threshold, reprogramming at least one of the first plurality of switches and the second plurality of switches to a different configuration.

10. The apparatus of claim 1, wherein:
a power feed included in the first plurality of power feeds electrically couples the first channel to a first power plant;
an additional power feed included in the first plurality of power feeds electrically couples the first channel to a second power plant;
a power feed included in the second plurality of power feeds electrically couples the second channel to the first power plant; and
an additional power feed included in the second plurality of power feeds electrically couples the second channel to the second power plant.

11. The apparatus of claim 1, further comprising a power output of the power supply that provides a summation of power drawn from the first channel and the second channel to a computing device.

12. The apparatus of claim 11, further comprising:
a channel of an additional power supply;
an additional channel of the additional power supply; and
a power output of the additional power supply that provides a summation of power drawn from the channel and the additional channel to the computing device to enable the computing device to consume the summation of power drawn from the channel and the additional channel in addition to the summation of power drawn the first channel and the second channel.

13. A system comprising:
a first plurality of power feeds that are electrically ORed to form a channel input for a first channel of a power supply, wherein the channel input is electrically coupled to the first channel of the power supply;
a first plurality of switches electrically coupled inline on the first plurality of power feeds, wherein the first plurality of switches are individually programmable to open or close electrical continuity across the first plurality of power feeds;
a first plurality of current-control components that are electrically coupled inline on the first plurality of power feeds, wherein the first plurality of current-control components are configured to prevent current from flowing away from the first channel of the power supply via any of the first plurality of power feeds;
a second plurality of power feeds that are electrically ORed to form an additional channel input for a second channel of the power supply, wherein the additional channel input is electrically coupled to the second channel of the power supply;
a second plurality of switches electrically coupled inline on the second plurality of power feeds, wherein the second plurality of switches are individually programmable to open or close electrical continuity across the second plurality of power feeds; and
a second plurality of current-control components that are electrically coupled inline on the second plurality of power feeds, wherein the second plurality of current-control components are configured to prevent current from flowing away from the second channel of the power supply via any of the second plurality of power feeds.

14. The system of claim 13, wherein:
the first plurality of current-control components comprises a first set of power field-effect transistors; and
the second plurality of current-control components comprises a second set of power field-effect transistors.

15. The system of claim 14, wherein:
the first plurality of switches comprises a third set of power field-effect transistors; and
the second plurality of switches comprises a fourth set of power field-effect transistors.

16. The system of claim 15, wherein:
each power feed included in the first plurality of power feeds comprises a power field-effect transistor included in the first set of power field-effect transistors electrically coupled in series with a power field-effect transistor included in the third set of power field-effect transistors; and
each power feed included in the second plurality of power feeds comprises a power field-effect transistor included in the second set of power field-effect transistors electrically coupled in series with a power field-effect transistor included in the fourth set of power field-effect transistors.

17. The system of claim 16, wherein:
an orientation of the power field-effect transistor included in the first set of power field-effect transistors and an orientation of the power field-effect transistor included in the third set of power field-effect transistors are arranged opposite of one another within each power feed included in the first plurality of power feeds; and
an orientation of the power field-effect transistor included in the second set of power field-effect transistors and an orientation of the power field-effect transistor included in the fourth set of power field-effect transistors are arranged opposite of one another within each power feed included in the second plurality of power feeds.

18. The system of claim 13, further comprising a controller of the power supply communicatively coupled to the first plurality of switches and the second plurality of switches, wherein the controller programs the first plurality of switches and the second plurality of switches to a specific configuration.

19. A method comprising:
electrically ORing a first plurality of power feeds to form a channel input for a first channel of a power supply;
electrically coupling the channel input to the first channel of the power supply;
electrically coupling a first plurality of switches inline on the first plurality of power feeds to facilitate controlling electrical continuity across the first plurality of power feeds;
electrically ORing a second plurality of power feeds to form an additional channel input for a second channel of the power supply;
electrically coupling the channel input to the second channel of the power supply;
electrically coupling a second plurality of switches inline on the second plurality of power feeds to facilitate controlling electrical continuity across the second plurality of power feeds;
electrically coupling a first plurality of current-control components inline on the first plurality of power feeds such that the first plurality of current-control components are configured to prevent current from flowing away from the first channel of the power supply via any of the first plurality of power feeds; and
electrically coupling a second plurality of current-control components inline on the second plurality of power feeds such that the second plurality of current-control components are configured to prevent current from flowing away from the second channel of the power supply via any of the second plurality of power feeds.

* * * * *